US012568786B2

(12) United States Patent
Shen et al.

(10) Patent No.: US 12,568,786 B2
(45) Date of Patent: Mar. 3, 2026

(54) PROCESSING TOOL AND METHOD

(71) Applicant: Taiwan Semiconductor Manufacturing Company, Ltd., Hsinchu (TW)

(72) Inventors: Chi-Hsiang Shen, Tainan (TW); Jeng-Chi Lin, Hsinchu (TW); Te-Chien Hou, Kaohsiung (TW); Che-Hao Tu, Hsinchu (TW); Tang-Kuei Chang, Hsinchu (TW); Kei-Wei Chen, Tainan (TW); Hui-Chi Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 287 days.

(21) Appl. No.: 18/324,550

(22) Filed: May 26, 2023

(65) Prior Publication Data

US 2024/0395537 A1 Nov. 28, 2024

(51) Int. Cl.
*H01L 21/02* (2006.01)
*H01L 21/67* (2006.01)
*H01L 21/687* (2006.01)

(52) U.S. Cl.
CPC .. *H01L 21/02065* (2013.01); *H01L 21/67034* (2013.01); *H01L 21/67046* (2013.01); *H01L 21/68742* (2013.01); *H01L 21/68757* (2013.01)

(58) Field of Classification Search
CPC ......... H01L 21/02065; H01L 21/67034; H01L 21/67046; H01L 21/68742; H01L 21/68757; H01L 21/67051; H01L 21/68728
See application file for complete search history.

(56) References Cited

U.S. PATENT DOCUMENTS

| | | | | |
|---|---|---|---|---|
| 8,475,668 B2 * | 7/2013 | Tanaka | ............. | H01L 21/02057 |
| | | | | 134/28 |
| 8,531,814 B2 * | 9/2013 | Stone | ............... | H01L 21/68742 |
| | | | | 361/220 |
| 9,147,593 B2 * | 9/2015 | Lach | ................ | H01L 21/68728 |
| 11,521,865 B2 * | 12/2022 | Tsujikawa | ......... | H01L 21/31133 |
| 11,571,717 B2 * | 2/2023 | Dong | ............... | H01L 21/02057 |
| 12,278,135 B2 * | 4/2025 | Tonai | ............... | H01L 21/67051 |

(Continued)

FOREIGN PATENT DOCUMENTS

JP        07221062 A   *   2/1994

OTHER PUBLICATIONS

JP-07221062-A, Machine Translation. (Year: 2025).*

*Primary Examiner* — Joshua L Allen
*Assistant Examiner* — Christopher Remavege
(74) *Attorney, Agent, or Firm* — Ingrassia Fisher & Lorenz, LLP

(57) ABSTRACT

Provided are a tool and a method for processing a semiconductor wafer. A processing method includes supporting a semiconductor wafer continuously along a periphery of the semiconductor wafer with an electrically grounded conductive member; and spinning the semiconductor wafer, wherein surface charges induced during spinning are dissipated by movement of electrons from the semiconductor wafer to the electrically grounded conductive member at the periphery of the semiconductor wafer.

20 Claims, 9 Drawing Sheets

(56) References Cited

U.S. PATENT DOCUMENTS

| | | | |
|---|---|---|---|
| 2008/0314870 A1* | 12/2008 | Inoue | H01L 21/68728 118/58 |
| 2010/0265631 A1* | 10/2010 | Stone | H01L 21/6831 29/559 |
| 2011/0089137 A1* | 4/2011 | Tanaka | H01L 21/02057 216/13 |
| 2011/0254236 A1* | 10/2011 | Brugger | H01L 21/68792 279/125 |
| 2012/0200980 A1* | 8/2012 | Blake | H01L 21/6831 361/212 |
| 2014/0097580 A1* | 4/2014 | Lach | H01L 21/68728 279/157 |
| 2014/0331927 A1* | 11/2014 | Nakano | H01L 21/02052 118/620 |
| 2015/0243543 A1* | 8/2015 | Schwarzenbacher | H01L 21/68785 279/142 |
| 2016/0197000 A1* | 7/2016 | Kim | H01L 21/68792 134/58 R |
| 2020/0295634 A1* | 9/2020 | Lenz | H01R 39/025 |
| 2021/0280397 A1* | 9/2021 | Kurosawa | H01L 21/67069 |
| 2022/0076919 A1* | 3/2022 | Paul | C23C 16/463 |
| 2022/0266308 A1* | 8/2022 | Dong | H01L 21/02057 |

* cited by examiner

PROCESSING TOOL AND METHOD

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of semiconductor devices, various processing steps are used to fabricate integrated circuits on a semiconductor wafer. Generally, the processes include a chemical mechanical polishing (CMP) process for planarization of semiconductor wafers. CMP is a widely used process by which both chemical and mechanical forces are used to globally planarize a semiconductor wafer. The planarization prepares the wafer for the formation of a subsequent layer. A typical CMP tool includes a rotating platen covered by a polishing pad. A slurry distribution system is configured to provide a polishing mixture, having chemical and abrasive components, to the polishing pad. A workpiece is then brought into contact with the rotating polishing pad to planarize the workpiece. CMP is a favored process because it achieves global planarization across the entire wafer surface. The CMP process polishes and removes materials from the wafer, and works on multi-material surfaces. Furthermore, the CMP process avoids the use of hazardous gasses, and/or is usually a low-cost process.

A challenge of many processes is to produce a clean substrate surface following the CMP process. The efficient and complete removal of the polishing slurry and other polishing residues and particulates following polishing is desirable in order to prevent introduction of defects into the polished product. Ideally, post-CMP cleaning should remove all polishing slurry, polishing residues and particulates in a quick and repeatable fashion without introducing additional defects or damage to the substrate surface.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

DETAILED DESCRIPTION

Figure 1:
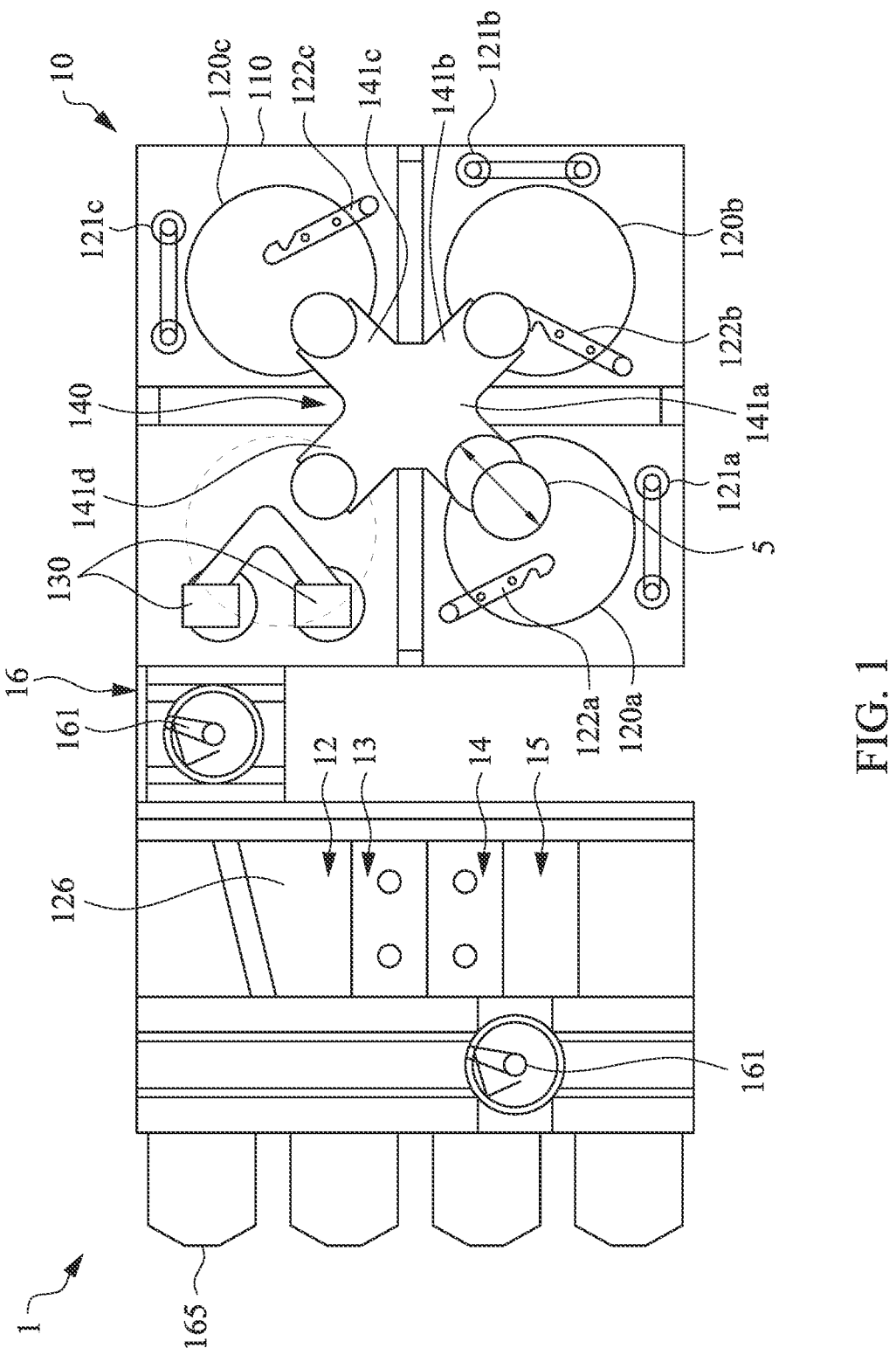
FIG. 1 is a schematic view of a processing system in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, techniques related to other semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many typical processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

Various embodiments herein involve rinsing processes in which a semiconductor wafer is rotated at a rotational speed, which may be between typically about 30 RPM and about 5,000 RPM. Simultaneously, a water jet of de-ionized water is sprayed onto the upper surface of the rotating wafer from a nozzle. As the water strikes the surface of the wafer, the water jet is typically scanned along a top of the wafer surface by a lateral sweeping motion of the water jet nozzle to define a generally curved or arcuate trace which normally traverses the center of the wafer. The surface of the wafer is scanned by the water jet at least once, and preferably, several times. Centrifugal force acting on the water flow on the surface of the wafer due to the rotating wafer platform and wafer removes contaminating particles or films from the surface of the wafer. After completion of the jet-scrubbing process, the wafer is subjected to a spin-drying step in which the wafer is rotated. Optionally, nitrogen or clean dry air (CDA) may be blown against the wafer surface.

Rotation of the wafer frequently results in electrostatic charging of the wafer surface. Further, high speed cleaning with de-ionized water may induce surface charges. De-ionized water has high resistivity characteristics, and the accumulation of surface charges on the wafer surface may lead to corrosion defects. Specifically, the presence of electrostatic charges on the surface of the wafer increases particle contamination of the wafer surface. This ultimately leads to defect densities in the finished chips or dies fabricated on the wafer, as revealed by chip testing. Furthermore, electrostatic charges on the surface of the wafer may interfere with the operation of production equipment, thus decreasing up-time, interrupting process flow or requiring re-processing of the semiconductor products.

Herein, methods and tools reduce or eliminate the build-up or accumulation of electrostatic charges during rinsing, spinning, and/or drying of wafers. Specifically, in embodiments herein, during the rinsing, spinning, and/or drying process, the semiconductor wafer is located on a grounded conductive chuck that encircles the bottom edge or sidewall of the wafer, i.e., the periphery of the wafer. As a result, a maximum horizontal distance from any location on the surface of wafer to a conductive path to ground is equal to, or less than, the radius of the wafer.

FIG. 1 is a schematic view of a processing system 1 for processing a semiconductor wafer 5, in accordance with some embodiments. In certain embodiments, the processing system 1 is a Chemical Mechanical Polishing (CMP) system. The CMP system 1 includes a CMP module or tool 10, a rinse station module 12, a number of cleaning modules, such as the cleaning modules 13 and 14, a rinsing, spinning, and/or drying module 15, and a number of transferring modules 16. The elements of the CMP system 1 can be added to or omitted, and the disclosure should not be limited by the embodiments.

The CMP module 10 includes a central processing unit (CPU) that may control operation of all other modules, tools, or other components described herein. As used herein, the term module refers to any hardware, software, firmware, electronic control unit or component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality. In some embodiments, the CMP module 10 is in communication with other CMP modules, with other tools, with automated wafer transport shuttles, and with a general control system for production of semiconductor devices.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SIC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, a shallow trench isolation (STI) layer, an inter-layer dielectric (ILD), or an inter-metal dielectric layer covers the device elements formed on the semiconductor wafer 5.

The CMP module 10 is configured for performing a planarization process on a semiconductor wafer 5 in a semiconductor manufacturing process. In some embodiments, the CMP module 10 includes a base 110, a number of polishing pads 120a, 120b, and 120c, a number of load cups 130, and a head rotation unit 140. The elements of the CMP module 10 can be added to or omitted, and the disclosure should not be limited by the embodiments.

In some embodiments, the polishing pads 120a, 120b, and 120c are provided on the base 110. The three polishing pads 120a, 120b and 120c facilitate simultaneous processing of multiple wafers in a short time. Each of the polishing pads is mounted on a rotatable carousel (not shown in the figures). Pad conditioners 121a, 121b and 121c are provided on the base 110 and can be swept over the respective polishing pads 120a, 120b and 120c for conditioning of the polishing pads 120a, 120b and 120c. Slurry supply arms 122a, 122b and 122c are further provided on the base 110 for supplying slurry to the surfaces of the respective polishing pads 120a, 120b and 120c.

The load cups 130 are configured for the loading and unloading of semiconductor wafers 5. In some embodiments, each the load cup 130 includes a circular pedestal on which the semiconductor wafer 5 is placed for loading the semiconductor wafer 5 onto the polishing pads 120*a*, 120*b*, and 120*c*, and for unloading the semiconductor wafer 5 from the polishing pad 120*a*, 120*b*, and 120*c*.

The head rotation unit 140 has a number of polishing heads 141*a*, 141*b*, 141*c*, and 141*d* for holding and fixedly rotating the semiconductor wafers 5 on the polishing pads 120*a*, 120*b*, and 120*c*. The polishing heads 141*a*, 141*b*, 141*c*, and 141*d* of the head rotation unit 140 are mounted on respective rotation shafts (not shown in the figures) which are rotated by a driving mechanism inside the head rotation unit 140. The polishing heads 141*a*, 141*b*, 141*c*, and 141*d* hold respective semiconductor wafers 5 and press the semiconductor wafers 5 against the top surfaces of the respective polishing pads 120*a*, 120*b*, and 120*c*. In this manner, material layers are removed from the respective semiconductor wafers 5.

The rinse station module 12 includes a container 126 in accordance with some embodiments. The container 126 is configured for submerging a semiconductor wafer 5 within a cleaning fluid contained therein. In some embodiments, the rinse station module 12 may include a transducer (not shown in the figures) mounted to the bottom of the container 126. The transducer is used to direct sonic energy upward to the semiconductor wafer 5. Thus, sonic energy from the transducer is directed vertically toward to the semiconductor wafer 5. As a result, the semiconductor wafer 5 is impacted by equal amounts of sonic energy during each full revolution of the semiconductor wafers 5.

The first cleaning module 13 is arranged adjacent to the rinse station module 12 and is configured to receive the semiconductor wafer 5 which has been cleaned by the rinse station module 12. In some embodiments, the first cleaning module 13 includes a cleaning tank, a cleaning brush assembly, and a liquid agitation assembly.

Referring to FIG. 1, the second cleaning module 14 is arranged adjacent to the first cleaning module 13 and is configured to receive the semiconductor wafer 5 which has been cleaned by the first cleaning module 13. The second cleaning module 14 may be the same or different from the first cleaning module 13. In addition, the cleaning liquid supplied to the first cleaning module 13 may be the same or different from that supplied to the second cleaning module 14. Moreover, the agitated cleaning liquid in different cleaning modules may be agitated at the same or different frequency, so as to enhance cleaning efficiency.

In the illustrated embodiment, the rinsing, spinning, and/ or drying module 15 is arranged adjacent to the second cleaning module 14 and is configured to receive the semiconductor wafer 5 which has been cleaned by the second cleaning module 14. When the semiconductor wafer 5 is transferred to the rinsing, spinning, and/or drying module 15, the semiconductor wafer 5 is rinsed with de-ionized water and then dried.

The transferring module 16 includes one or more driving elements (not shown in figures) and a number of robot arms 161, in accordance with some embodiments. The driving element, such as a motor, is controlled by a control module and is coupled to the robot arms 161. The robot arms 161 are driven by the driving element to provide both radial and rotational movement in a fixed plane to pick up, transfer, and deliver the semiconductor wafer 5 from one location within the CMP system 1 to another. For example, with the transferring module 16, the semiconductor wafer 5 is transferred between a carrier 165, such as a FOUP, and the CMP module 10. Alternatively, the semiconductor wafer 5 is transferred between the CMP module 10 and the rinse station module 12 by the transferring module 16. Alternatively, the semiconductor wafer 5 is transferred between the rinsing, spinning, and/or drying module 15 and the carrier 165.

Figure 2:
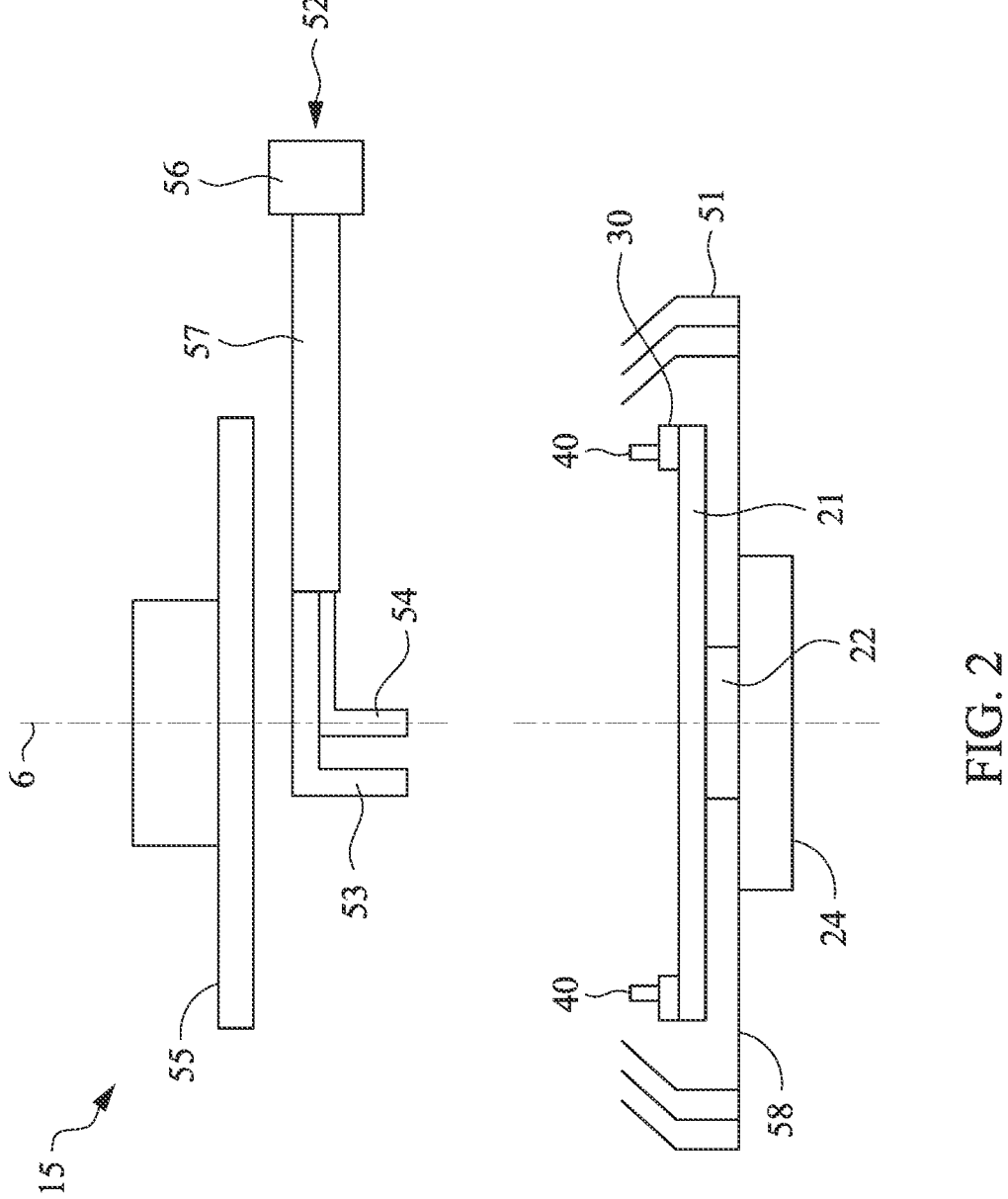
FIG. 2 is a schematic view of a rinsing, spinning, and/or drying tool of the processing system of FIG. 1 in accordance with some embodiments.

FIG. 2 is a schematic view of an embodiment of a rinsing, spinning, and/or drying tool or module 15, which is configured to rinse and dry semiconductor wafers. In some embodiments, the module 15 includes a high-speed rotation chamber. In some embodiments, the module 15 includes a catch cup 51, a transferring module 52, a number of supply units, such as first supply unit 53 and second supply unit 54, a shield plate 55, a conductive chuck member 30 and a number of catch or chuck pins 40. It should be appreciated that additional features can be added to the module 15, and some of the features described below can be replaced or eliminated in other embodiments of the module 15.

In certain embodiments, the conductive chuck member 30 is in the form of a hollow cylinder, hoop, or ring, such as a hollow rectangular ring or rectangular torus, and is referred to herein as a conductive chuck ring 30.

In some embodiments, the catch cup 51 is configured to provide an environment for cleaning the semiconductor wafer. The catch cup 51 is a circular cup having an open top. The upper portion of the cup wall tilts inward to facilitate retaining waste within the catch cup 51. The catch cup 51 is connected to an exhaust system via a liquid waste drain formed on a bottom wall 58. As a result, the catch cup 51 is able to catch and drain waste liquid solution for the wafer cleaning process via the liquid waste drain.

The transferring module 52 is configured to move the supply units. The transferring module 52 includes one or more driving elements 56, and a robot arm 57, in accordance with some embodiments. The driving element 56, such as a motor, is controlled by the control module and is coupled to the robot arm 57. The robot arm 57 is driven by the driving element to provide both radial and rotational movement in a fixed plane to move the supply units 53 and 54 from one location within the module 15 to another.

In some embodiments, the first supply unit 53 is mounted on the transferring module 52 and configured to supply a cleaning liquid to the semiconductor wafer. The cleaning liquid may include an aggregate of two or more substances. The cleaning liquid may be used to clean the wafer and to remove the metal dregs that attach to the wafer surface. The second supply unit 54 is mounted on the transferring module 52 and configured to spray a washing liquid to the semiconductor wafer. The washing liquid may include an aggregate of two or more substances.

The shield plate 55 is positioned relative to the catch cup 51 and configured to supply a processing liquid, such as de-ionized water or isopropyl alcohol (IPA), or processing gas to dry the semiconductor wafer. In some embodiments, the shield plate 55 is arranged to move along the central axis 6. When the shield plate 55 is used to supply the processing liquid or discharge gas, the shield plate 55 may be lowered to approach the semiconductor wafer.

While FIG. 2 describes supplying a cleaning liquid from supply unit 53, a cleaning liquid from supply unit 54, and a processing liquid 80 from shield plate 55, it is contemplated that module 15 applies a single liquid, such as processing liquid 80 in the form of de-ionized water, to the wafer.

Still referring FIG. 2, the conductive chuck ring 30 is configured for holding, positioning, moving, rotating, and otherwise manipulating a semiconductor wafer. In some embodiments, the conductive chuck ring 30 is connected to a spin base 21 and a rotatable spindle 22 connected to a motor 24 configured to drive rotation of the spindle 22. For example, the motor 24 may generate a driving torque by using electricity.

The spin base 21 has a disk shape and is disposed in the catch cup 51. In some embodiments, the spin base 21 is arranged to rotate about a central axis 6. The spin base 21 may be also designed to be operable for translational and vertical motions. In addition, the conductive chuck ring 30 may be designed to tilt or dynamically change the tilt angle.

In some embodiments, the conductive chuck ring 30 further includes a lifting mechanism (not shown in figures). The lifting mechanism may be connected to the spin base 21 and/or conductive chuck ring 30 for facilitating a vertical movement of the conductive chuck ring 30 so as to move into contact with the semiconductor wafer.

In some embodiments, the conductive chuck ring 30 is a material selected from conductive metal film, graphene, indium tin oxide (ITO), or an intrinsically conductive polymer. In other embodiments, the conductive chuck ring 30 is formed from another suitable conductive material. As used herein, "conductive" means electrically conductive. In some embodiments, a conductive member described herein has a resistivity less than $10^8$ Ωcm at 30° C. to 180° C., such as less than $10^5$ Ωcm at 30° C. to 180° C., or less than $10^{-4}$ Ωcm at 30° C. to 180° C.

As shown, chuck pins 40 may extend upward from the conductive chuck ring 30. In certain embodiments, the chuck pins 40 are conductive and are grounded. In certain embodiments, the chuck pins 40 are formed from the same material as the conductive chuck ring 30. In certain embodiments, the chuck pins 40 are a material selected from conductive metal film, graphene, indium tin oxide (ITO), or an intrinsically conductive polymer. In other embodiments, the chuck pins 40 are formed from another suitable conductive material.

The chuck pins 40 may be operated in association with each other to clamp and unclamp the semiconductor wafer. Alternatively, one or two of the chuck pins 40 may operate independently of the other chuck pins 40. For example, one of the chuck pins 40 may not be able to rotate relative to the spin base 21, such that the rotation angle of that chuck pin 40 is fixed. On the other hand, the other two chuck pins 40 may be operated in association with each other to clamp and unclamp the semiconductor wafer.

Figure 3:
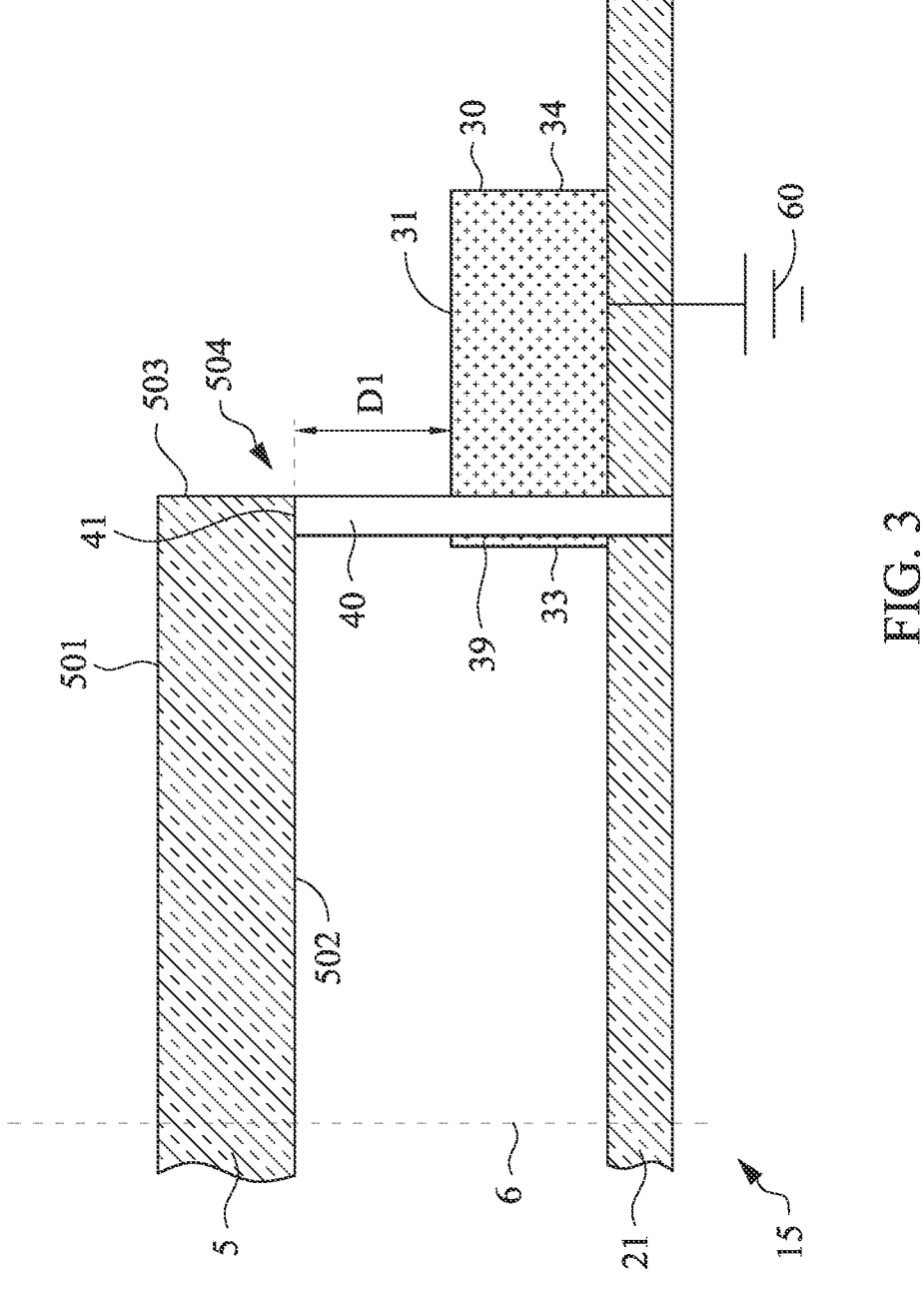
FIG. 3 is a cross-sectional schematic view of a stage of a method for processing a semiconductor wafer in which the rinsing and drying tool of FIG. 2 is opened and the semiconductor wafer is received on chuck pins in accordance with some embodiments.

In FIG. 3, a semiconductor wafer 5 is received in the module 15 for processing. Specifically, the wafer 5 is received by the chuck pins 40. In some embodiments, the semiconductor wafer 5 is transferred to the chuck pins 40 by a robotic blade that lowers the semiconductor wafer 5 along a direction that is parallel to a central axis 6 to place the semiconductor wafer 5 over the chuck pins 40, with the center of the semiconductor wafer 5 aligned with the central axis 6. In some embodiments, the semiconductor wafer 5 is selectively secured to the chuck pins 40 such as by a clamping force.

As shown, the wafer 5 has a front or top surface 501 and a rear or bottom surface 502 that each terminate at an outer cylindrical edge 503. Specifically, the bottom surface 502 and/or outer cylindrical edge 503, i.e., the periphery 504, of the wafer 5 is received by and held by the upper surfaces or top ends 41 of the chuck pins 40. As shown in FIG. 3, module 15 is in an opened configuration such that the upper surfaces or tops ends 41 of the chuck pins 40 is distanced from a top surface 31 of the conductive chuck ring 30 by a distance D1.

As shown in FIG. 3, each chuck pin 40 may pass through a bore 39 formed in the chuck ring 30, and through the spin base 21. Alternatively, the chuck pins 40 may be located adjacent to the chuck ring 30, such as radially inside the inner cylindrical surface 33 of the chuck ring 30 or radially outside the outer cylindrical surface 34 of the chuck ring 30.

The top surface 31 of the chuck ring 30 extends radially outward, i.e., away from the center of the wafer 5 through which the rotation axis 6 passes, from an inner cylindrical surface 33 to an outer cylindrical surface 34. In some embodiments, the inner cylindrical surface 33 is a cylindrical concave surface centered about axis 6 and the outer cylindrical surface 34 is a cylindrical convex surface centered about axis 6.

As shown, the conductive chuck ring 30 is grounded via electrical connection to a ground 60. In certain embodiments, the chuck pins 40 are conductive and are grounded, such as via electrical connection to the ground 60.

Figure 4:
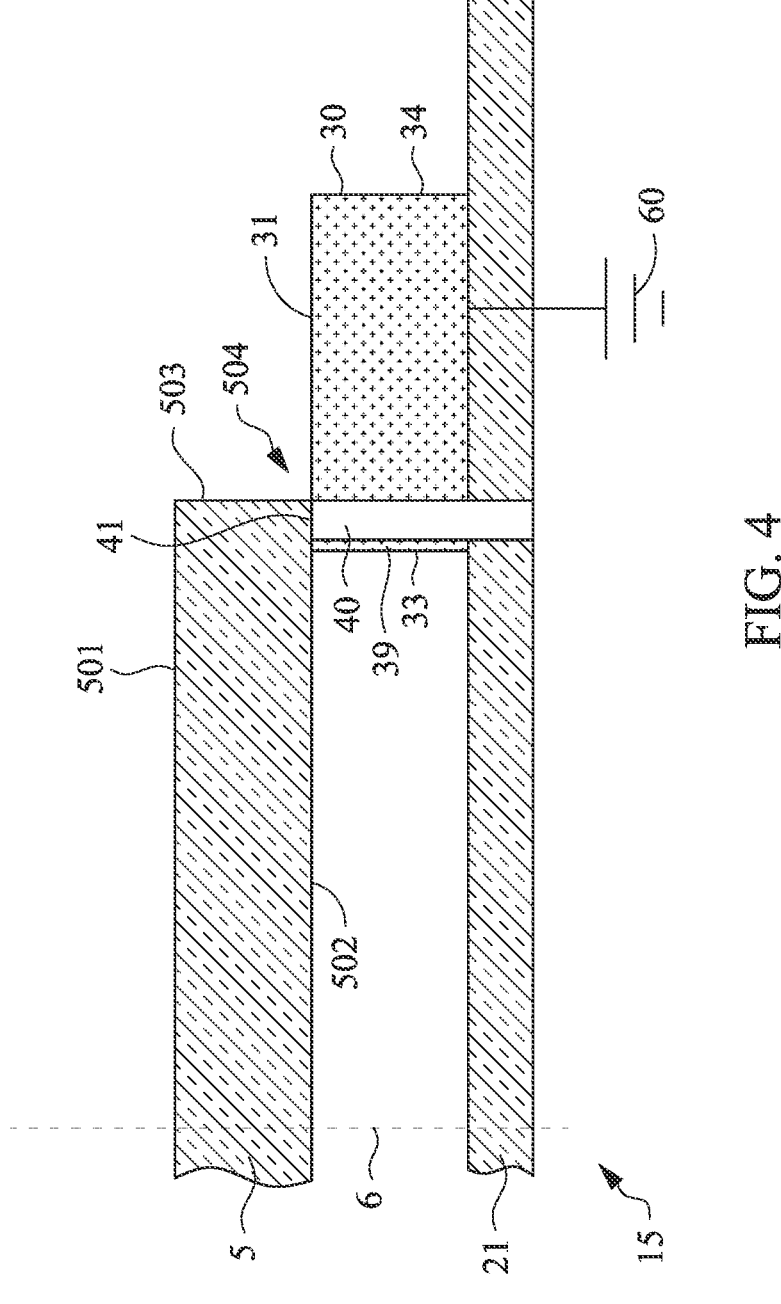
FIG. 4 is a cross-sectional schematic view of a stage of a method for processing a semiconductor wafer in which the rinsing and drying tool of FIG. 3 is closed to bring the wafer into contact with a conductive chuck ring in accordance with some embodiments.

In FIG. 4, module 15 is in a closed configuration such that the distance D1 between the top surfaces 41 of the chuck pins 40 and the top surface 31 is reduced to zero. In the illustrated embodiment, the top surfaces 41 of the chuck pins 40 are aligned with the top surface 31 of the chuck ring 30. In another embodiment, the top surfaces 41 of the chuck pins 40 are recessed within the bores 39. In either embodiment, the bottom surface 502 and/or outer edge 503 of the semiconductor wafer 5, i.e., the periphery 504 of the wafer 5, contacts the top surface 31 of the conductive chuck ring 30. In certain embodiments, the semiconductor wafer 5 is held or secured to, and supported by, the top surface 31 of the conductive chuck ring 30.

Figure 5:
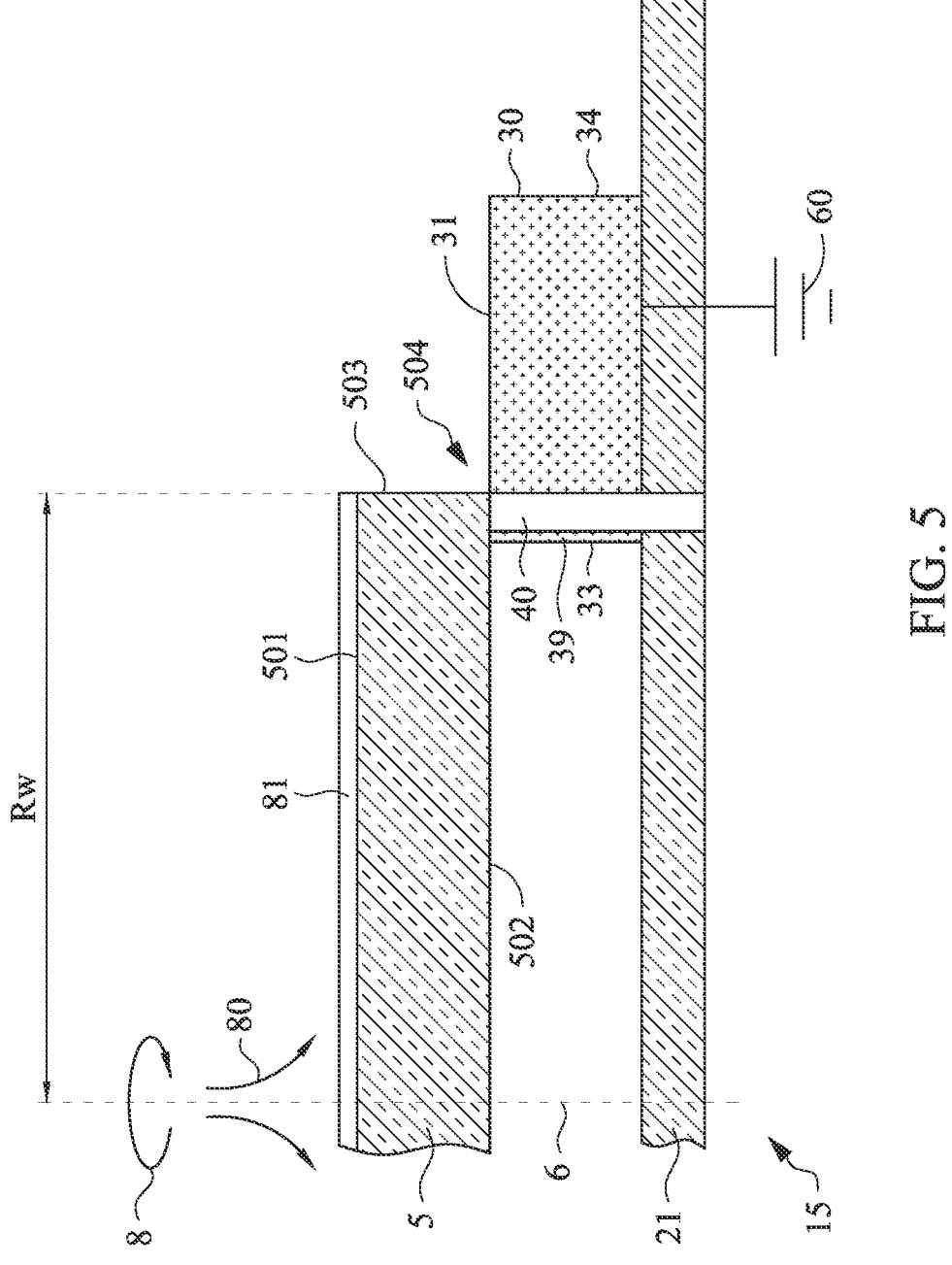
FIG. 5 is a cross-sectional schematic view of a stage of a method for processing a semiconductor wafer in which the rinsing and drying tool of FIG. 4 spins, rinses and dries the wafer in accordance with some embodiments.

In FIG. 5, the semiconductor wafer 5 is rotated by the spin base 21, as powered by the motor 24 (FIG. 2), in the direction of arrow 8 about the central axis 6. Further, in FIG. 5, a processing liquid 80 is dispensed over the top surface 501 of the semiconductor wafer 5. In some embodiments, as shown in FIG. 5, the processing liquid 80 is supplied to a center portion of the top surface 501 of the semiconductor wafer 5 from the shield plate 55 (FIG. 2). The processing liquid 80 is acted upon by centrifugal force generated by the rotation of the semiconductor wafer 5 to flow toward the outer edge 503 of the semiconductor wafer 5. Thus, a processing liquid film 81 having a predetermined thickness (e.g., about 1 mm) is formed on the top surface 501 of the semiconductor wafer 5. As shown, the processing liquid film 81 extends along the radius Rw of the top surface 501 of wafer 5 from the axis 6 to the outer edge 503. In certain embodiments, radius Rw is from 150 to 250 millimeters (mm).

The dispensing of the processing liquid 80 may be performed in a drying process so as to dry the semiconductor wafer 5. In some embodiments, before the drying process, a prior-stage cleaning process is performed over the semiconductor wafer 5. In the prior-stage cleaning process, a cleaning liquid (such as a SC1 solution) or a washing liquid (such as a SC2 solution) is supplied from the first supply unit 53 (FIG. 2) or the second supply unit 54 (FIG. 2) so as to remove particles or oxidation material on the semiconductor wafer 5. After the semiconductor wafer 5 is cleaned by the cleaning liquid or the washing liquid, the processing liquid 80 is supplied over the semiconductor wafer 5 to remove the cleaning liquid or the washing liquid used in the prior-stage cleaning process. The processing liquid 80 may be any suitable liquid such as de-ionized water, isopropyl alcohol (IPA), acetone, alcohol, monocthanolamine (MEA) and combinations thereof.

In certain embodiments, drying of the semiconductor wafer 5 may be enhanced by supplying a processing gas over the semiconductor wafer 5. During the supply of the processing gas, the semiconductor wafer 5 may be rotated at the rotation speed of the semiconductor wafer 5 to 10 to 500 rpm, for example, to increase the efficiency of removing the processing liquid film 81. In some embodiments, the processing gas includes an inert gas, such as nitrogen gas.

After the processing liquid film 81 is completely removed from the top surface 501 of the semiconductor wafer 5, the semiconductor wafer 5 is removed from the module 15, such as by a robotic blade, and the process for cleaning the semiconductor wafer 5 is completed.

Figure 7:
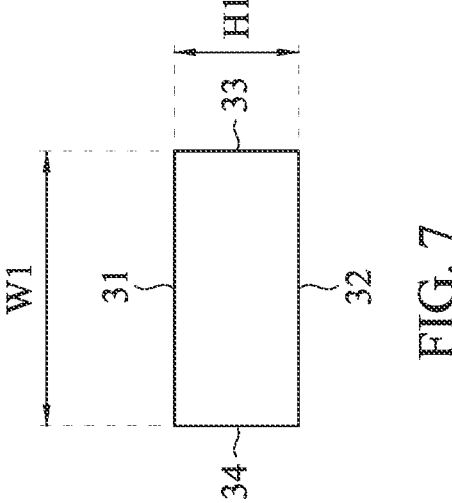
FIG. 7 is a cross-sectional view of the conductive chuck ring, taken along line 7-7 in FIG. 6.
Figure 6:
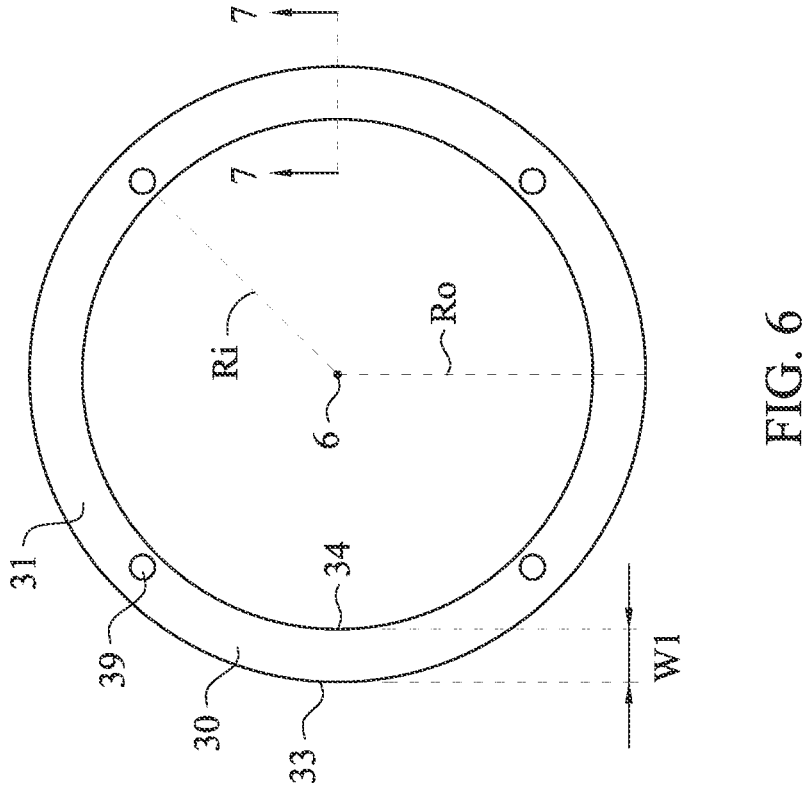
FIG. 6 is an overhead view of the conductive chuck ring of the tool of FIG. 2 in accordance with some embodiments.

Referring to FIGS. 6 and 7, the structure of the conductive chuck ring 30 is illustrated. Specifically, FIG. 6 is an overhead view of the top surface 31 of the conductive chuck ring 30 and FIG. 7 is a cross-sectional view of the conductive chuck ring 30 taken along line 7-7 in FIG. 6.

In FIG. 6, conductive chuck ring 30 is formed with openings or bores 39 through which the chuck pins may be positioned. In FIG. 6, the conductive chuck ring 30 is formed with four bores 39; however, if present, the number of bores 39 may be any suitable number of three or greater. In some embodiments, the bores 39 are equidistantly circumferentially-spaced about the conductive chuck ring 30. The bores 39 may be located nearer to the inner surface 33, nearer to the outer surface 34, or equidistantly spaced between the inner surface 33 and outer surface 34. In some embodiments, the bores 39 may be partially formed by the inner surface 33 or by the outer surface 34 such that the pins contact but do not pass through the conductive chuck ring 30, i.e., such that the bores 39 are not completely surrounded by the conductive chuck ring 30. In other embodiments, no bores 39 are present such that the chuck pins do not pass through the conductive chuck ring 30.

Cross-referencing FIGS. 6-7, conductive chuck ring 30 has a radial width W1, in a radial direction defined by axis 6, from inner surface 33 to outer surface 34. For example, the top surface 31 extends from inner surface 33 to outer surface 34 and has a radial width W1. In some embodiments, the radial width is from 1 to 200 millimeters (mm).

In the illustrated embodiment, the inner surface 33 is cylindrical, such as circular cylindrical. In some embodiments, the inner surface 33 is distanced from the axis 6 by an inner radius Ri. Inner radius Ri is from 150 to 250 millimeters (mm), such that the conductive chuck ring 30 has an inner diameter of from 300 to 500 millimeters (mm), in certain embodiments.

In the illustrated embodiment, the outer surface 34 is cylindrical, such as circular cylindrical. In some embodiments, the outer surface 34 is distanced from the axis 6 by an outer radius Ro. Outer radius Ro is from 150.5 to 250.5 millimeters (mm) in certain embodiments, such that the conductive chuck ring 30 has an outer diameter of from 301 to 501 millimeters (mm), in certain embodiments.

In FIG. 7, the conductive chuck ring 30 has a bottom surface 32 opposite the top surface 31. In some embodiments, the conductive chuck ring 30 has a vertical thickness or height H1 from bottom surface 32 to top surface 31, in a direction parallel to axis 6. In some embodiments, the inner surface 33 extends from bottom surface 32 to top surface 31 along height H1. In some embodiments, the outer surface 34 extends from bottom surface 32 to top surface 31 along height H1. In some embodiments, height H1 is from 0.5 to 20 centimeters (cm).

Figure 8:
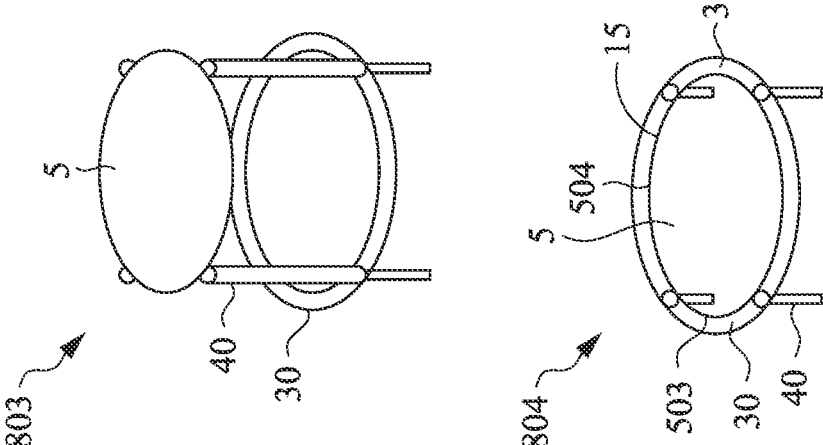
FIG. 8 is a schematic illustration of four stages of the chuck ring and chuck pins receiving a wafer in accordance with some embodiments.
Figure 8:
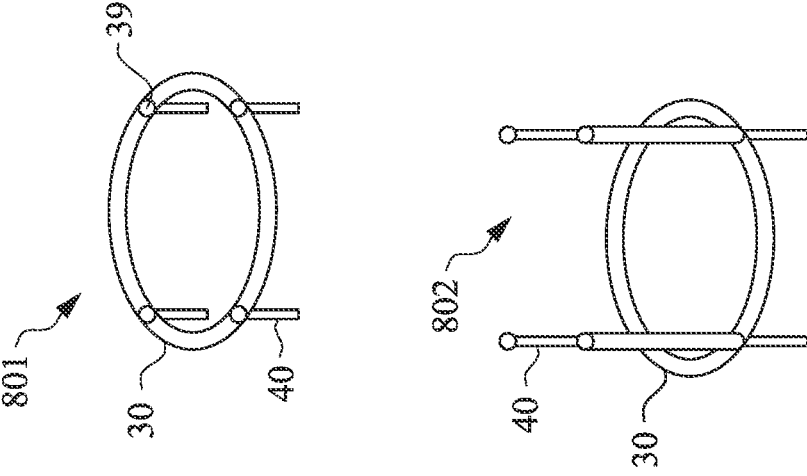

Referring to FIG. 8, a schematic illustrates stages of loading or unloading a wafer 5 onto or from the conductive chuck ring 30. Specifically, an empty closed stage 801, an empty open stage 802, a loaded open stage 803, and a loaded closed stage 804 are illustrated. In each stage of FIG. 8, the conductive chuck ring 30 is formed with four bores 39 for four chuck pins 40; however, the number of bores 39 and pins 40 may be any suitable number of three or greater. In some embodiments, the bores 39 and pins 40 are equally circumferentially spaced about the conductive chuck ring 30. The bores 39 and pins 40 may be located nearer to the inner surface 33, nearer to the outer surface 34, or equally spaced between the inner surface 33 and outer surface 34.

At empty closed stage 801, the chuck pins 40 do not extend above the chuck ring 30 and no wafer 5 is located on the chuck pins 40. At empty open stage 802, the chuck pins 40 extend above the chuck ring 30 and no wafer 5 is located on the chuck pins 40. At loaded open stage 803, the chuck pins 40 extend above the chuck ring 30 and a wafer 5 is located on the chuck pins 40. At loaded closed stage 804, the chuck pins 40 do not extend above the chuck ring 30 and wafer 5 is located on the chuck pins 40 and on chuck ring 30.

As shown in FIG. 8, at loaded closed stage 804, the wafer 5 contacts the conductive chuck ring 30 and the conductive chuck pins 40 along the outer edge 503 and/or bottom surface, i.e., along an interfacial periphery 504. In certain embodiments, the periphery 504 is a continuous, 360-degree ring, such that the periphery 504 of the wafer 5 is completely surrounded by the chuck ring 30.

Figure 9:
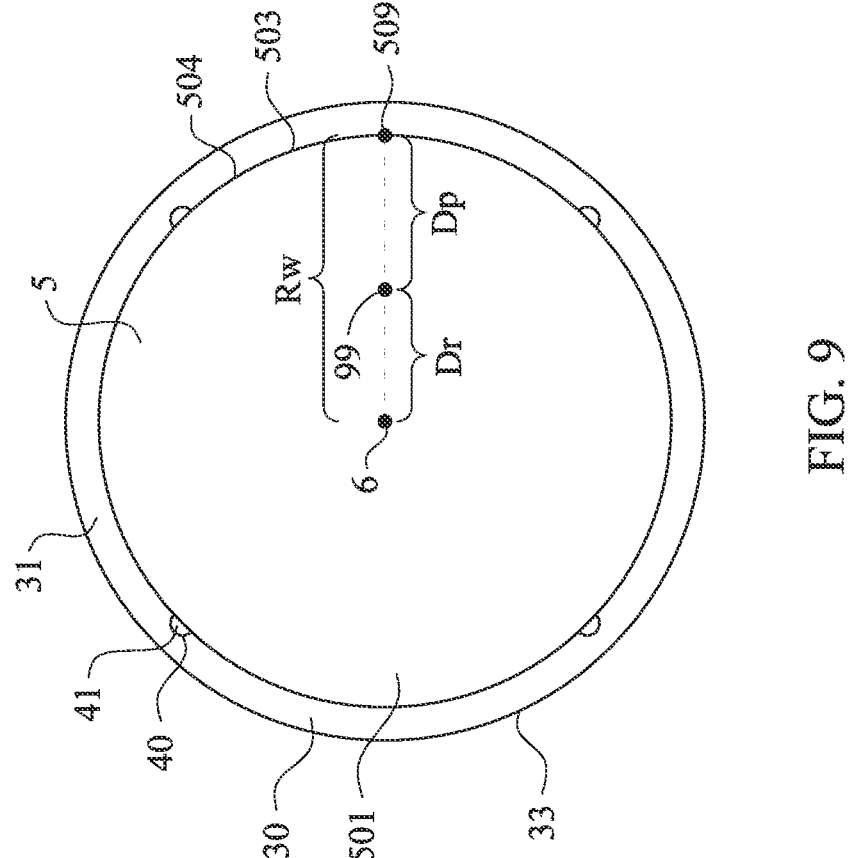
FIG. 9 is an overhead view of the wafer received on the conductive chuck ring and chuck pins of the tool of FIG. 2 in accordance with some embodiments.

In FIG. 9, the interface along the periphery 504 between the wafer 5 and the conductive chuck ring 30 is illustrated from an overhead view. As shown, the chuck ring 30 extends radially outward from the outer edge 503 of the wafer 5 to an outer cylindrical surface 34. The outer edge 503 lies directly over the conductive chuck ring 30 and may pass directly over the top surfaces 41 of the chuck pins 40 as shown.

As can be seen in FIG. 9, any location on the surface 501 of the wafer 5 is provided with the shortest possible length of a straight-line path to grounded conductive chuck ring 30 or grounded chuck pin 40. For example, location 99 on the surface 501 of the wafer is located along a radius from axis 6 to nearest point 509 on the outer edge 503. The radial distance Rw from axis 6 to outer edge 503 is equal to the sum of the radial distance Dr from axis 6 to location 99 and the radial distance Dp from location 99 to point 509 on the outer edge 503. The radial distance Dp is the minimum discharge path for the location 99. By providing a grounded conductive interface along the periphery 504 of the wafer 5, each location is provided with a minimum discharge path located on a radial path from the axis 6 to the outer edge 503.

As described in FIGS. 1-9, the process performed by the tool 15 reduces accumulation or build-up of electrostatic charges on the wafer 5 during the spin-drying process. Specifically, by providing a continuous electrical contact between the outer edge 503 and/or bottom surface 502 of the semiconductor wafer 5 and the grounded conductive chuck ring 30 or grounded chuck pins 40, no location on the top surface 501 is distanced from an electrical discharge path by a horizontal distance greater than the radius Rw of the wafer 5. Further, a radial path to the outer edge 503 is provided as a minimum discharge path for every location on the top surface 501 of the wafer 5.

Figure 10:
FIG. 10 is a flow chart illustrating a method for processing a wafer in accordance with some embodiments.

Referring to FIG. 10, a flow chart of a method 900 for processing a semiconductor wafer 5, such as while manufacturing a semiconductor device, is illustrated. Cross-referencing FIG. 10 with FIGS. 1-9, method 900 includes receiving a wafer 5 in a processing system 1 at S910.

Method 900 includes performing a process on the wafer 5 with the processing system 1 at S920. In some embodiments, the processing system 1 includes a tool including a CMP chamber, an isopropyl alcohol (IPA) chamber, a pencil brush chamber, a double pencil brush chamber, a brush chamber, or a pre-clean chamber, and the process includes performing a CMP process, a cleaning process, a pre-cleaning process, a brushing process, and/or other process.

Method 900 includes loading the wafer 5 in rinsing module at S930. For example, the chuck pins 40 and chuck ring 30 may be moved from stage 801 to stage 802, the wafer may be located onto the chuck pins 40 in stage 803, and the module 15 may be closed as shown in stage 804.

Method 900 further includes performing a rinsing, spinning, and/or drying process at S940. Specifically, a processing liquid 80 is dispensed over the top surface 501 of the semiconductor wafer 5 and flows off of the outer edge 503 of the wafer 5. The wafer 5 is spun while located and held on chuck ring 30 or on the chuck ring 30 and chuck pins 40. For example, the chuck ring 30 or the chuck ring 30 and chuck pins 40 support the semiconductor wafer 5 continuously along a periphery 504 of the semiconductor wafer 5. Spinning the semiconductor wafer induces surface charges. In certain embodiments, after rinsing with the processing liquid 80, the wafer 5 is first spun at a lower rotational speed before being spun at a higher rotational speed.

Method 900 also includes, during the rinsing, spinning, and/or drying process, discharging electrostatic charges from the wafer 5 to the conductive chuck ring 30 or to the conductive chuck ring 30 and the conductive chuck pins 40, along minimum discharge paths, i.e., along a radial path from any location on the wafer 5 to the nearest point on the outer edge 503 of the wafer 5, at S950. Thus, S950 includes dissipating charges induced during spinning by movement of electrons from the semiconductor wafer to the electrically grounded conductive member at the periphery of the semiconductor wafer.

Further, method 900 may include removing the wafer 5 from the module 15 at S960, such as by moving the wafer 5 from stage 804 to stage 803, before lifting the wafer 5 with a robotic blade that raises the wafer 5 from the chuck pins 40.

Method 900 may also include performing another process on the wafer 5 with the processing system 1 at S970.

As described herein, a tool and method for processing wafers provide for the reduction or elimination of static charge build-up on wafers, such as during high-speed rotation in a rinsing process. Specifically, each wafer is provided with a minimum discharge path for reducing electrostatic charges on the surface of the wafer. A minimum discharge path is a radial path in the direction defined by a radius from the wafer center to the wafer outer edge. Thus, every location on the surface of the wafer is provided with a discharge path to a grounded conductive ring located at the nearest available location at the perimeter of the wafer.

As device dimensions scale down, the significance of levels of corrosion increases and such corrosion must be minimized, as metal corrosion defects may cause patterns under etch which cannot connect to pre-layer patterns, thus negatively affecting yield.

By avoiding or reducing wafer surface charge build-up, metal corrosion due to wafer surface charges in a CMP high speed spin chamber is avoided or reduced. By providing a minimum, i.e., shortest straight-line distance, discharge path for every location on the wafer, the tool and method provide for a reduction in metal corrosion defects, a reduction in metal corrosion that may lead to fan-type scratches or circle scratches, such as due to less metal ion build-up on pencil brushes or double pencil brushes or due to less metal ion build-up on brushes. Further, by providing a minimum, i.e., shortest straight-line distance, discharge path for every location on the wafer, surfaces charges escape or leave the wafer surface in the shortest distance to obtain a better surface charge variation range and avoid metal corrosion.

In an embodiment, a method includes supporting a semiconductor wafer continuously along a periphery of the semiconductor wafer with an electrically grounded conductive member; and spinning the semiconductor wafer, wherein surface charges induced during spinning are dissipated by movement of electrons from the semiconductor wafer to the electrically grounded conductive member at the periphery of the semiconductor wafer.

In an embodiment, the method further includes receiving the semiconductor wafer with catch pins, wherein the semiconductor wafer is distanced from the electrically grounded conductive member; and closing the catch pins, wherein when the catch pins are closed the periphery of the semiconductor wafer contacts the electrically grounded conductive member. In such an embodiment, the catch pins pass through the electrically grounded conductive member. In such an embodiment, the catch pins are conductive, and the catch pins and the electrically grounded conductive member are a same material. In such an embodiment, the catch pins are conductive, and supporting the semiconductor wafer continuously along the periphery of the semiconductor wafer with the electrically grounded conductive member includes supporting the semiconductor wafer continuously along the periphery of the semiconductor wafer with the electrically grounded conductive member and with the catch pins.

In an embodiment of the method, the electrically grounded conductive member is a conductive metal film, graphene, indium tin oxide (ITO), and/or an intrinsically conductive polymer.

In an embodiment of the method, when supporting the semiconductor wafer, the electrically grounded conductive member continuously surrounds a bottom edge of the semiconductor wafer.

In an embodiment of the method, spinning the semiconductor wafer includes spin-drying the semiconductor wafer, and the method includes rinsing the semiconductor wafer with de-ionized water before spin-drying the semiconductor wafer.

In an embodiment, the method further includes performing a process before rinsing the semiconductor wafer, wherein the process is selected from an isopropyl alcohol (IPA) pre-cleaning or cleaning process, a pencil cleaning process, a double pencil cleaning process, and a brush cleaning process.

In an embodiment of the method, the semiconductor wafer is supported by a top surface of the electrically grounded conductive member, wherein the electrically grounded conductive member has a thickness from the top surface to an opposite bottom surface, and wherein the thickness is from 0.5 to 20 centimeters (cm).

In an embodiment of the method, the semiconductor wafer is supported by a top surface of the electrically grounded conductive member, wherein the top surface has a radial width extending in a radial direction from an inner edge to an outer edge, and wherein the radial width is from 1 to 200 millimeters (mm).

In an embodiment of the method, the electrically grounded conductive member is annular and has an inner diameter and an outer diameter, wherein the inner diameter is from 300 to 500 millimeters, and wherein the outer diameter is from 301 to 500 millimeters.

In another embodiment, a method includes opening catch pins from a conductive chuck ring; locating a semiconductor wafer on the catch pins; closing the catch pins, wherein the semiconductor wafer contacts the conductive chuck ring, and wherein the conductive chuck ring extends radially outward from the semiconductor wafer; holding the semiconductor wafer on the conductive chuck ring; and spinning the conductive chuck ring and catch pins to perform a process on the semiconductor wafer.

In an embodiment, the method further includes, after spinning the conductive chuck ring and catch pins to perform the process on the semiconductor wafer, opening the catch pins from the conductive chuck ring; and removing the semiconductor wafer from the catch pins.

In an embodiment of the method, the process includes a spin-drying process.

In another embodiment, a semiconductor processing tool includes a conductive chuck ring; catch pins configured for movement between an open configuration, in which top surfaces of the catch pins are distanced above an upper surface of the conductive chuck ring to receive a semiconductor wafer, and a closed configuration in which the top surfaces are not distanced above the upper surface to position the semiconductor wafer on the conductive chuck ring; an electrical ground connected to the conductive chuck ring; and a motor configured to spin the conductive chuck ring and the semiconductor wafer received thereon around an axis.

In an embodiment of the semiconductor processing tool, the catch pins are conductive, and the catch pins and the conductive chuck ring are a same material.

In an embodiment of the semiconductor processing tool, the conductive chuck ring is a conductive metal film, graphene, indium tin oxide (ITO), and/or an intrinsically conductive polymer.

In an embodiment of the semiconductor processing tool, the conductive chuck ring has a thickness from a top surface to an opposite bottom surface, and wherein the thickness is from 0.5 to 20 centimeters (cm).

In an embodiment of the semiconductor processing tool, the conductive chuck ring has a top surface with a radial width extending in a radial direction from an inner edge to an outer edge, and wherein the radial width is from 1 to 200 millimeters (mm).

In an embodiment of the semiconductor processing tool, the conductive chuck ring has an inner diameter and an outer diameter, wherein the inner diameter is from 300 to 500 millimeters, and wherein the outer diameter is from 301 to 500 millimeters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

supporting a semiconductor wafer along a periphery of the semiconductor wafer with a top surface of an electrically grounded conductive member; and spinning the semiconductor wafer, wherein surface charges induced during spinning are dissipated by movement of electrons from the semiconductor wafer to the electrically grounded conductive member at the periphery of the semiconductor wafer.

2. The method of claim 1, further comprising:

receiving the semiconductor wafer with catch pins, wherein the semiconductor wafer is distanced from the electrically grounded conductive member; and closing the catch pins, wherein when the catch pins are closed the periphery of the semiconductor wafer contacts the electrically grounded conductive member.

3. The method of claim 2, wherein the catch pins pass through the electrically grounded conductive member.

4. The method of claim 2, wherein the catch pins are conductive, and wherein the catch pins and the electrically grounded conductive member comprise a same material.

5. The method of claim 2, wherein the catch pins are conductive, and wherein supporting the semiconductor wafer along the periphery of the semiconductor wafer with the electrically grounded conductive member comprises supporting the semiconductor wafer continuously along the periphery of the semiconductor wafer with the electrically grounded conductive member and with the catch pins.

6. The method of claim 1, wherein the electrically grounded conductive member comprises a conductive metal film, graphene, indium tin oxide (ITO), and/or an intrinsically conductive polymer.

7. The method of claim 1, wherein spinning the semiconductor wafer comprises spin-drying the semiconductor wafer, and wherein the method comprises rinsing the semiconductor wafer with de-ionized water before spin-drying the semiconductor wafer.

8. The method of claim 7, further comprising performing a process before rinsing the semiconductor wafer, wherein the process is selected from an isopropyl alcohol (IPA) pre-cleaning or cleaning process, a pencil cleaning process, a double pencil cleaning process, and a brush cleaning process.

9. The method of claim 1, wherein the electrically grounded conductive member has a thickness from the top surface to an opposite bottom surface, and wherein the thickness is from 0.5 to 20 centimeters (cm).

10. The method of claim 1, wherein the top surface has a radial width extending in a radial direction from an inner edge to an outer edge, and wherein the radial width is from 1 to 200 millimeters (mm).

11. A method comprising:

supporting a semiconductor wafer along a periphery of the semiconductor wafer with an electrically grounded conductive member, wherein the electrically grounded conductive member is annular and has an inner diameter and an outer diameter; and spinning the semiconductor wafer, wherein surface charges induced during spinning are dissipated by movement of electrons from the semiconductor wafer to the electrically grounded conductive member at the periphery of the semiconductor wafer.

15

12. A method comprising:

opening catch pins from a conductive chuck ring;

locating a semiconductor wafer on the catch pins;

closing the catch pins, wherein the semiconductor wafer contacts the conductive chuck ring, and wherein the conductive chuck ring extends radially outward from the semiconductor wafer;

holding the semiconductor wafer on the conductive chuck ring; and spinning the conductive chuck ring to perform a process on the semiconductor wafer.

13. The method of claim 12, further comprising:

after spinning the conductive chuck ring to perform the process on the semiconductor wafer, opening the catch pins from the conductive chuck ring; and removing the semiconductor wafer from the catch pins.

14. The method of claim 12, wherein the process comprises a spin-drying process.

15. The method of claim 12, further comprising:

dispensing a processing liquid over the semiconductor wafer; and supplying a processing gas over the semiconductor wafer during spinning to enhance drying of the semiconductor wafer during a drying process, wherein the processing gas comprises an inert gas.

16. The method of claim 15, wherein spinning the conductive chuck ring comprises rotating the semiconductor wafer at a rotational speed between 10 RPM and 500 RPM during the drying process.

17. The method of claim 12, further comprising dispensing a processing liquid over a top surface of the semiconductor wafer, wherein the processing liquid forms a film having a thickness of about 1 mm on the top surface due to centrifugal force from spinning.

18. The method of claim 12, wherein the conductive chuck ring is formed from a material having a resistivity less than $10^8$ Ωcm at a temperature range of 30° C. to 180° C.

19. The method of claim 12, wherein the conductive chuck ring is formed from a material having a resistivity less than $10^5$ Ωcm at a temperature range of 30° C. to 180° C., and wherein the conductive chuck ring has a radial width from an inner cylindrical surface to an outer cylindrical surface, wherein the radial width is from 1 to 200 millimeters, and wherein the inner cylindrical surface is distanced from a central axis of rotation by an inner radius of from 150 to 250 millimeters.

20. The method of claim 12, wherein:

the catch pins are conductive;

the catch pins and the conductive chuck ring comprise a same material;

the conductive chuck ring comprises a conductive metal film, graphene, indium tin oxide (ITO), and/or an intrinsically conductive polymer;

the conductive chuck ring has a thickness from a top surface to an opposite bottom surface;

the thickness is from 0.5 to 20 centimeters (cm);

the conductive chuck ring has a top surface with a radial width extending in a radial direction from an inner edge to an outer edge;

the radial width is from 1 to 200 millimeters (mm);

the conductive chuck ring has an inner diameter and an outer diameter;

the inner diameter is from 300 to 500 millimeters; and the outer diameter is from 301 to 501 millimeters.

* * * * *